US012665010B2

(12) United States Patent
Chih et al.

(10) Patent No.: US 12,665,010 B2
(45) Date of Patent: Jun. 23, 2026

(54) MAGNETORESISTIVE RANDOM-ACCESS MEMORY (MRAM)

(71) Applicant: Taiwan Semiconductor Manufacturing Company, Ltd., Hsinchu (TW)

(72) Inventors: Yu-Der Chih, Hsin-Chu (TW); Chia-Fu Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 99 days.

(21) Appl. No.: 18/394,849

(22) Filed: Dec. 22, 2023

(65) Prior Publication Data

US 2025/0210086 A1      Jun. 26, 2025

(51) Int. Cl.
| | |
|---|---|
| *G11C 16/04* | (2006.01) |
| *G11C 11/16* | (2006.01) |
| *H10B 61/00* | (2023.01) |
| *H10N 50/10* | (2023.01) |

(52) U.S. Cl.
CPC ........ *G11C 11/1675* (2013.01); *G11C 11/161* (2013.01); *G11C 11/1673* (2013.01); *G11C 11/1677* (2013.01); *H10B 61/00* (2023.02); *H10N 50/10* (2023.02)

(58) Field of Classification Search
CPC .............. G11C 11/1675; G11C 11/161; G11C 11/1673; G11C 11/1677
See application file for complete search history.

(56) References Cited

U.S. PATENT DOCUMENTS

| | | | | |
|---|---|---|---|---|
| 10,867,652 | B2 | 12/2020 | Gupta et al. | |
| 11,594,269 | B2 * | 2/2023 | Lee ......................... | G11C 17/02 |
| 2019/0180173 | A1 * | 6/2019 | Torng .................. | G11C 11/1673 |
| 2020/0098440 | A1 * | 3/2020 | Chuang ............... | G11C 17/165 |
| 2021/0098034 | A1 | 4/2021 | Mantegazza | |

FOREIGN PATENT DOCUMENTS

TW          202029191 A      8/2020

* cited by examiner

*Primary Examiner* — Pho M Luu
(74) *Attorney, Agent, or Firm* — Merchant & Gould P.C.

(57) ABSTRACT

A method for identifying an IM state of MRAM cell writes includes providing a plurality of MRAM cells and partitioning the plurality of MRAM cells into a plurality of groups including a first group and a second group. A first MRAM cell of the first group is written from a first state to a second state and a second MRAM cell of the second group is written from the first state to the second state. The writing of the first MRAM cell is verified, including comparing a first read current of the first MRAM cell to a first reference value. The writing of the second MRAM cell is verified, including comparing a second read current of the second MRAM cell to a second reference value.

20 Claims, 9 Drawing Sheets

PRE-VERIFY CELLS TO BE WRITTEN — 310

PARTITION CELLS INTO GROUPS — 312

WRITE FROM FIRST STATE TO SECOND STATE — 314

VERIFY GROUP 1 CELLS USING REF1 — 316

VERIFY GROUP 2 CELLS USING REF2 — 318

REWRITE FAILED BITS — 320

300

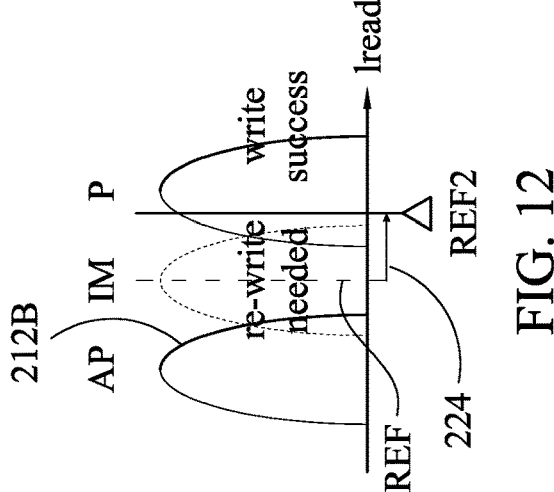
FIG. 10
FIG. 9
FIG. 8
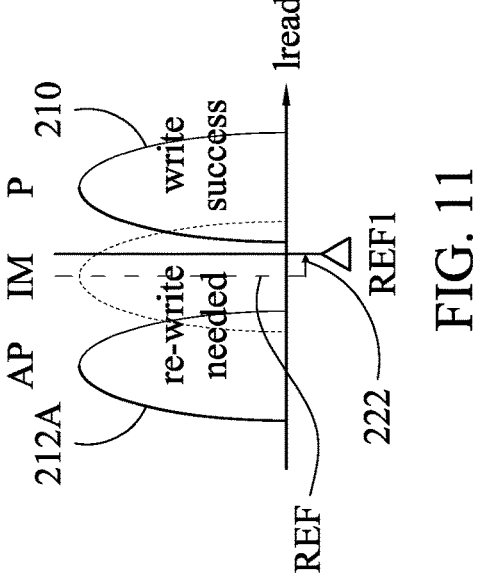
FIG. 12
FIG. 11

MAGNETORESISTIVE RANDOM-ACCESS MEMORY (MRAM)

BACKGROUND

Non-volatile memory is memory that retains data in the absence of power. Magnetoresistive random-access memory (MRAM) is a non-volatile random access memory (RAM) technology that uses magnetic storage elements to store data. An MRAM device includes an array of MRAM cells, each of which is implemented as a single-bit cell to store a binary data value. Each MRAM cell includes a magnetic tunnel junction ("MTJ" or "MTJ element") formed of a pair of ferromagnetic layers separated by a thin insulating layer. The two layers include a magnetic layer that is permanently magnetized in a fixed magnetic field alignment direction (this layer is referred to as a pinned layer), and a changeably-magnetized magnetic layer (this layer is referred to as a free layer).

The changeably-magnetized magnetic layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel), or the magnetic field of the changeable layer can be aligned directly opposite to that of the permanent magnet layer (anti-parallel). The parallel alignment state has a relatively lower resistance, namely a low logic state "0". The anti-parallel alignment state has a higher resistance, namely a high logic state "1". These two states as sensed from their relatively higher or lower resistances represent different binary logic values of bits in the memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIGS. 8-12 are charts illustrating aspects of the method illustrated in FIG. 7 in accordance with some embodiments.

DETAILED DESCRIPTION

Figure 1:
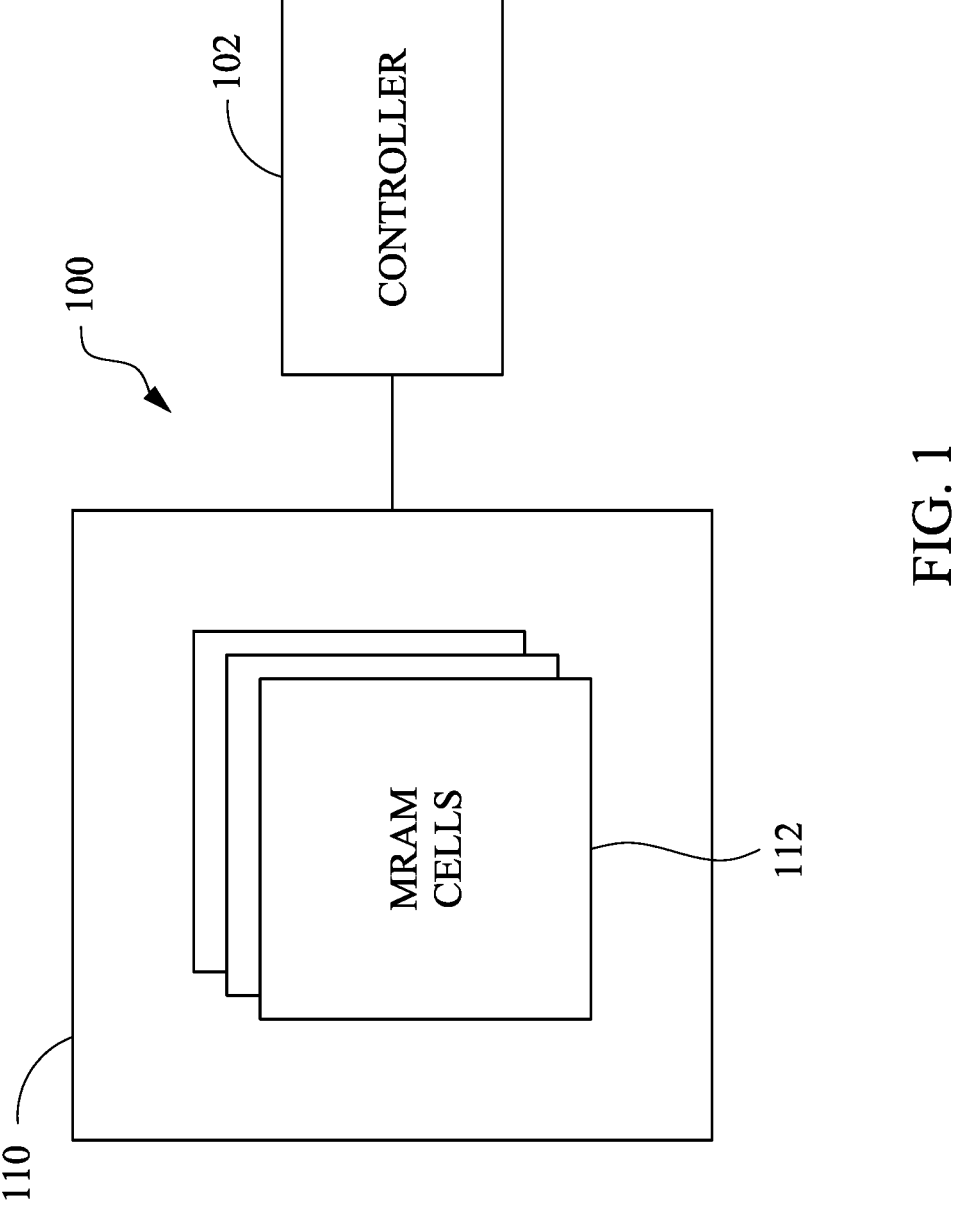
FIG. 1 is a block diagram illustrating an example of an MRAM memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetoresistive random-access memory (MRAM) is a non-volatile random access memory technology that uses magnetic storage elements to store data. An MRAM device includes an array of MRAM cells, each of which is implemented as a single-bit cell to store a binary data value. Each MRAM cell includes a magnetic tunnel junction ("MTJ" or "MTJ element") formed of a pair of ferromagnetic layers separated by a thin insulating layer. The two layers include a magnetic layer that is permanently magnetized in a fixed magnetic field alignment direction (this layer is referred to as a pinned layer), and a changeably-magnetized magnetic layer (this layer is referred to as a free layer).

The changeably-magnetized magnetic layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel), or the magnetic field of the changeable layer can be aligned directly opposite to that of the permanent magnet layer (anti-parallel). The parallel alignment state has a relatively lower resistance and the anti-parallel alignment state has a higher resistance. These two states as sensed from their relatively higher or lower resistances represent different binary logic values of bits in the memory.

The two states of an MRAM cell can be sensed from their relatively higher or lower resistances (RH and RL), which represent different binary logic values of a bit stored in the memory. For example, RL (or high cell current) may be designated as a logical "0" ("Data-0"); RH (or low cell current) may be designated as a logical "1" ("Data-1"). A bit of data, a logic "0" or "1" value, stored in a MRAM memory cell can be determined by comparing a current that flows through the memory cell to another current that flows through another memory cell.

More particularly, MRAM stores data at memory cells having the MTJ element formed of the pinned layer and the free layer, separated by a thin insulating layer. The free layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel, or "P") or opposite to that of the permanent magnet layer (anti-parallel, or "AP"). The parallel alignment state P has a relatively lower resistance and the anti-parallel alignment state AP has a higher resistance.

An issue associated with MRAM is the "intermediate state" (IM), which occurs when the MRAM's MTJ is subjected to a magnetic field that is not strong enough to fully switch its magnetic orientation. As noted above, to write data to an MRAM cell, a magnetic field is applied to change the orientation of one of the MRAM cell magnetic layers. If the field is strong enough, it fully switches the orientation, and the MTJ is in a stable state representing either 0 or 1.

However, if the magnetic field applied during a write operation is not strong enough to fully switch the magnetic orientation of the storage layer, the MTJ can end up in an intermediate state. In the intermediate state, the magnetic orientation is partially altered but not enough to reliably represent a 0 or 1. This intermediate state results in a resistance level that falls between the high and low resistance states. With read operations for an MRAM cell, the resistance state of the MTJ needs to be accurately detected. The presence of an intermediate state can complicate the read process, since the final state of the MRAM cell is unknown or difficult to assess.

Such an IM phenomenon may lead to data errors or disturb adjacent cells when reading or writing data. Some attempts to address the IM phenomenon include using higher write voltage or current, longer write time, multiple "shots" of applying the magnetic field, and the like. Such attempted solutions, however, can adversely impact MRAM cell endurance and write throughput.

In general, an MRAM read operation includes applying a sense current through the MTJ element of the MRAM cell. The sense current creates a voltage drop across the MTJ, and this voltage is amplified by a sense amplifier to detect changes in resistance. When the MTJ is in the P state (parallel, low resistance state), the current across the MTJ is different from when the MTJ is in the AP state (antiparallel, high resistance state). This difference in resistance leads to a difference in current and voltage at the output of the sense amplifier.

The current or voltage difference is compared to a reference value or threshold. If the measured current is below the reference, it indicates that the MTJ is in the high resistance state (AP), which typically represents one binary value (e.g., 1). If the current is above the reference, it indicates the low resistance state (parallel alignment), representing the other binary value (e.g., 0).

Various embodiments of the present application are directed to methods for addressing the IM phenomenon with MRAM memory cells, including using different reference values for MRAM cells subject to IM issues. FIG. 1 illustrates an example of MRAM memory device 100 in accordance with aspects of the present disclosure. The memory device 100 includes an array 110 of a plurality of MRAM cells. The memory device 100 further includes a memory controller 102 that receives a memory address and controls various components of the device 100 to read or write data to the array 110. The memory controller 102 may include various circuits as discussed further below.

Figure 2:
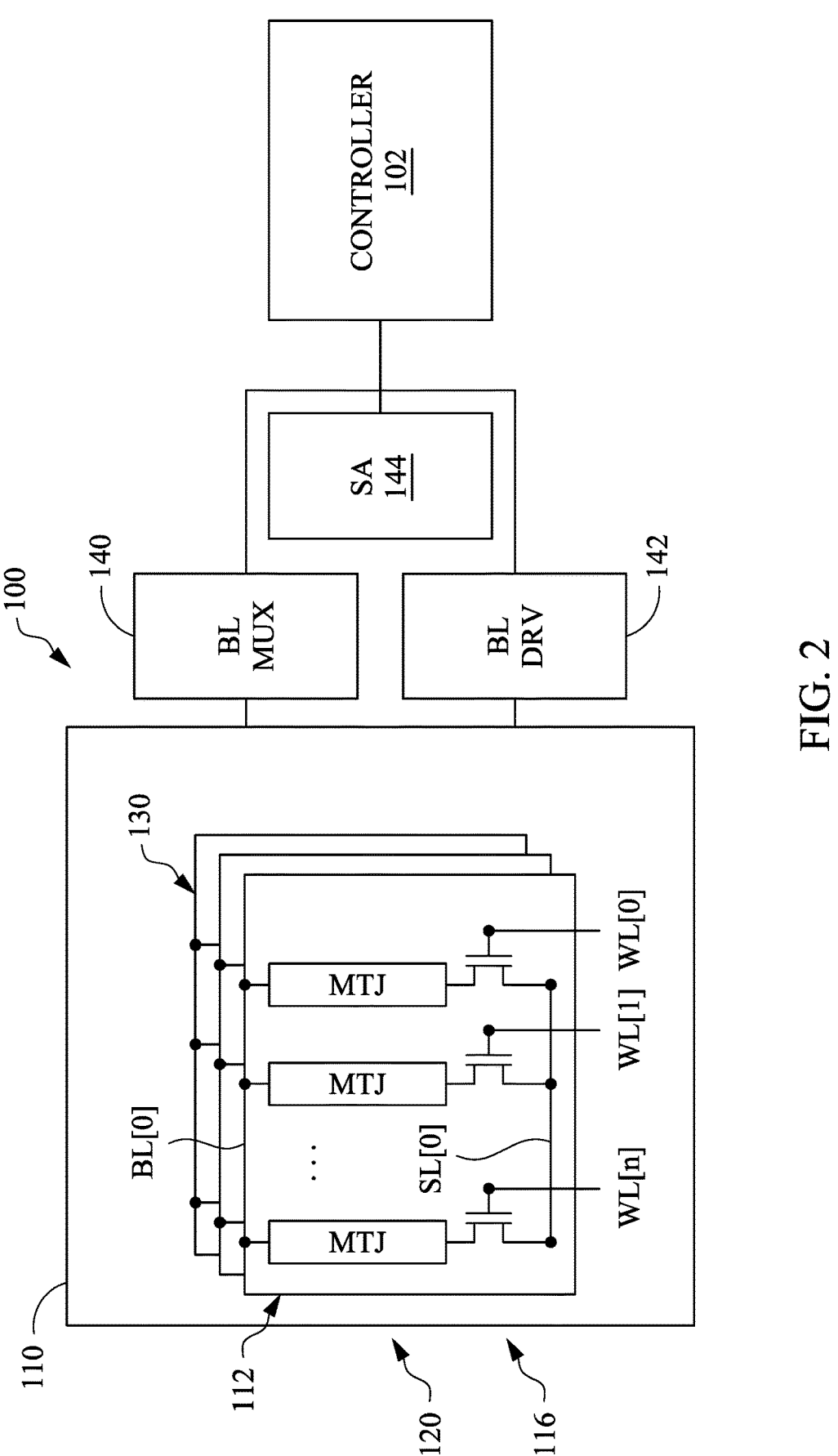
FIG. 2 is a block diagram illustrating further aspects of the example MRAM memory device of FIG. 1 accordance with some embodiments.

FIG. 2 illustrates further aspects of an example of the memory device 100. The MRAM array 110 includes an array of the MRAM bit cells 112 arranged in rows and columns. For simplicity of discussion, FIG. 2 shows only a single row of the MRAM bit cells 112 in detail. In the illustrated example, the MRAM bit cells 112 each include an MTJ element 120. Each column of the array 110 has a corresponding bit line BL and a corresponding source line SL. In FIG. 2, only the first bit line BL[0] and the first source line SL[0] for the first row of MTJ elements 120 are shown. Each row of the array has a corresponding word line WL. In the illustrated example, the rows of MRAM bit cells each have a corresponding memory word line WL[0-n], and the MRAM bit cells 112 are connected to the bit line BL[0].

Each of the MRAM bit cells 112 has a corresponding memory cell select transistor 116 coupled between the MTJ element 120 of the MRAM bit cell 112 and the source line SL[0]. Each of the memory cell select transistors 116 has its gate terminal coupled to the word line WL[0-n] for the corresponding row. In the illustrated example, the memory cell select transistors 116 are NMOS transistors, though other switching devices are within the scope of the disclosure.

The memory controller 102 of the memory device 100 further includes a sense amplifier 144 connected to the bit lines BL to read currents that flow through memory bit cells 112 and compare them to a reference current to read data from the memory array 110. The output of the sense amplifier 144 is then latched and used to determine the data read from the MRAM cell 112. The data can be sent to the memory controller 102 for further processing or storage. A bit line multiplexer 140 is configured to select a bit line BL based on a received memory address, and a bit line driver 142 configured to vary electrical potential on the bit lines BL.

In an exemplary write operation for writing data to the MRAM bit cells 112, write voltages are applied to the bit line BL0, the source line SL0, and the appropriate word line WL[0-n]. For instance, a voltage applied to the word line WL[0] activates the memory cell select transistor 116 connected thereto and a write current flows through the connected MRAM bit cell 112. That write current flows through the MTJ 120 of the MRAM bit cell 112, causing the MTJ 120 to switch from a parallel state to an anti-parallel state or vice versa, whereby a bit of data is written and stored in the MRAM bit cell 112. When it is desired to switch the MTJ 120 from the anti-parallel state to the parallel state to store a "0" value, a switch current is passed through the MTJ 120 from the free layer to the reference layer. Conversely, when it is desired to switch the MTJ 120 from the parallel state to the anti-parallel state to store a "1" value, a switch current is passed through the MTJ 120 from the reference layer to the free layer.

When the free layer of the MTJ 120 is in the parallel state, the MTJ 120 exhibits a low resistance that represents a logic "0" value and the MTJ 120 is said to be in a parallel state or a low resistance state P. Conversely, when the free layer is in the anti-parallel state, the MTJ 120 exhibits a high resistance that represents a logic "1" value and the MTJ 120 is said to be in an anti-parallel state or a high resistance state AP. In some embodiments, the logic represented by the MTJ 120 in a high or low resistance state is arbitrary, e.g. the logic "1" can be represented by the MTJ 120 in a low resistance state and the logic "0" can be represented by the MTJ 120 in a high resistance, and is determined by the desired convention used for the memory device. Whichever convention is chosen, the MTJ 120 can store binary data via two writeable and readable states, e.g. the high resistance and low resistance states. For purposes of consistency, embodiments described herein will use the convention that the MTJ 120 in the low resistance parallel state P represents a "0" and the MTJ 120 in the high resistance anti-parallel state AP represents a "1," unless otherwise stated.

In an exemplary read operation, read voltages are applied to the bit line BL[0] and the source line SL[0] associated with the column of a selected bit cell 112 to be read, as well as the word line WL[0-n]associated with the word line of a selected MRAM bit cell 112 to be read. For example, read voltages can be applied to the bit line BL[0], the source line SL[0], and the word line WL[0] to read the data bit stored in the connected MRAM bit cell 112. To select other cells, different combinations of bit lines, source lines, and word lines are activated to produce a read current indicative of the data stored at the respective cell.

Figure 3:
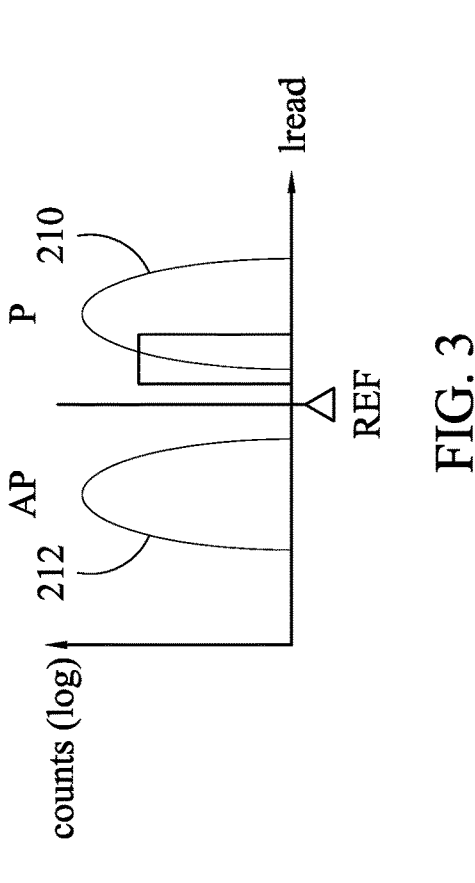
FIG. 3 is a chart illustrating an example of a distribution of read currents in example MTJ states of MRAM cells in accordance with some embodiments.

FIG. 3 illustrates an example of a distribution of the read currents in example MTJ states of the MRAM cells 112. In the example shown, when the MRAM bit cell 112 is read, a read current Iread flows through the MTJ 120, The magnitude of the read current Iread corresponds to a resistance state of the MTJ 120. For example, when the MTJ 120 is in a low resistance state, i.e., a parallel state P, the read current Iread will be greater than a reference current REF as shown with the curve 210 in FIG. 3. Conversely, when the MTJ 120 is in a high resistance state, i.e., an anti-parallel state AP, the read current Iread will be less than the reference current Iref as shown with the curve 212 in FIG. 3, indicating that the MRAM bit cell 112 stores a bit logic "I" value of data therein. The sense amplifier 144 can compare the read current Iread to the reference current REF to sense a bit logic "0" or "1" value of data stored in the MRAM bit cell 112. The sense amplifier 144 amplifies a level of the sensed bit of data and outputs the amplified bit of data such that the bit of data stored in the MRAM bit cell 112 can be read therefrom. In some examples, the reference current value is determined based on the peak read currents Iread for the AP and P states, such as $$(Ip+Iap)/2$$

where Ip is the peak read current Iread for the P state curve 210 and Iap is the peak read current Iread for the AP state curve 212. In some examples, the sense amplifier 144 is configured to compare the read current Iread to the reference value REF.

As noted above, the IM state can occur when the MRAM's MTJ is subjected to a magnetic field that is not strong enough to fully switch its magnetic orientation. Thus, if the magnetic field applied during a write operation is not strong enough to fully switch the magnetic orientation of the storage layer, the MTJ can end up in an intermediate state which results in a resistance level that falls between the high and low resistance states.

Figure 5:
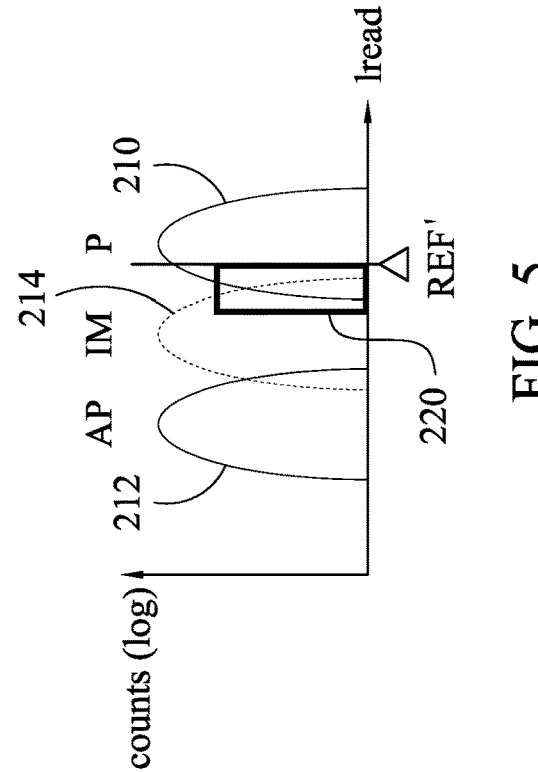
FIG. 5 is a chart illustrating further aspects of an example of a distribution of read currents in example MTJ states of MRAM cells in accordance with some embodiments.
Figure 4:
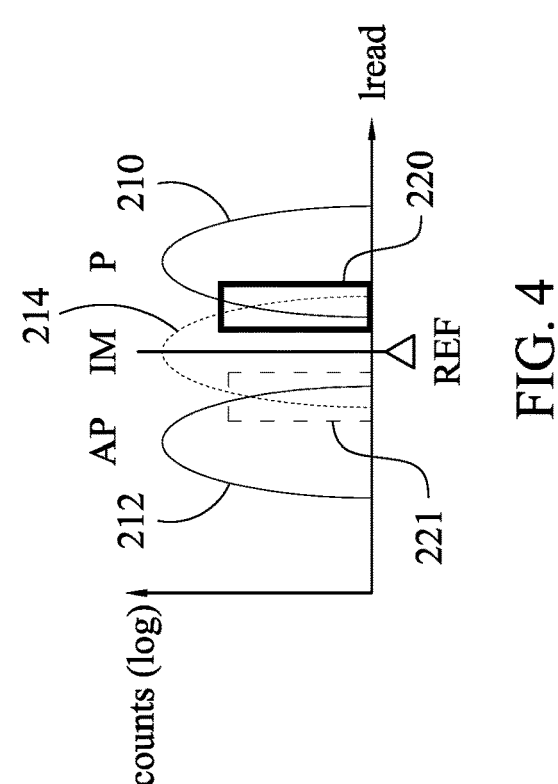
FIG. 4 is a chart illustrating further aspects of an example of a distribution of read currents in example MTJ states of MRAM cells in accordance with some embodiments.

FIG. 4 illustrates a current curve 214 indicating an IM state, where the MTJ is in an intermediate state (i.e. between the AP and P states), which results in a resistance level that falls between the high and low resistance states. The value of the reference current (or voltage) REF can be used to verify an MRAM cell write success or fail. Consider an example where an MRAM cell is being written from the AP state to the P state. As discussed above, the curve 210 illustrates a read current Iread greater than the reference REF, clearly indicating the P state of the MRAM cell 112. The right-side portion of the curve 214 illustrating the IM state is greater than the reference value REF, while the left-side portion of the curve 214 is less than the reference value REF. As further shown in FIG. 4, the IM state curve 214 and the P state curve 210 overlap in an area indicated by the box 220. Since a portion of the IM curve 214 is greater than the reference REF and coincides with the P state curve 210, it could possibly be considered as being written to the P state. However, this could result in an ambiguous read value, and the IM current could return to the AP value resulting in a write failure. The same situation exists where a portion 221 of the IM state curve 214 overlaps with the AP curve 212, possibly resulting in an ambiguous read value for reading cells written to the AP state, FIG. 5 illustrates a situation where the reference REF' is shifted to the right and used as the reference value for all "AP cells" (i.e. cells having a read current Iread that falls on the AP curve 212) that are to be written to the P state. If only those read current Iread values of the curve 210 that are greater than (i.e. to the right of) the reference value REF' are considered as indicating the MRAM cell 112 has been written to the P state, some MRAM cells may end up being considered a write failure, even though they exhibit a read current Iread higher than the original reference value REF. This could result in unnecessary MRAM cell rewrites.

Figure 6:
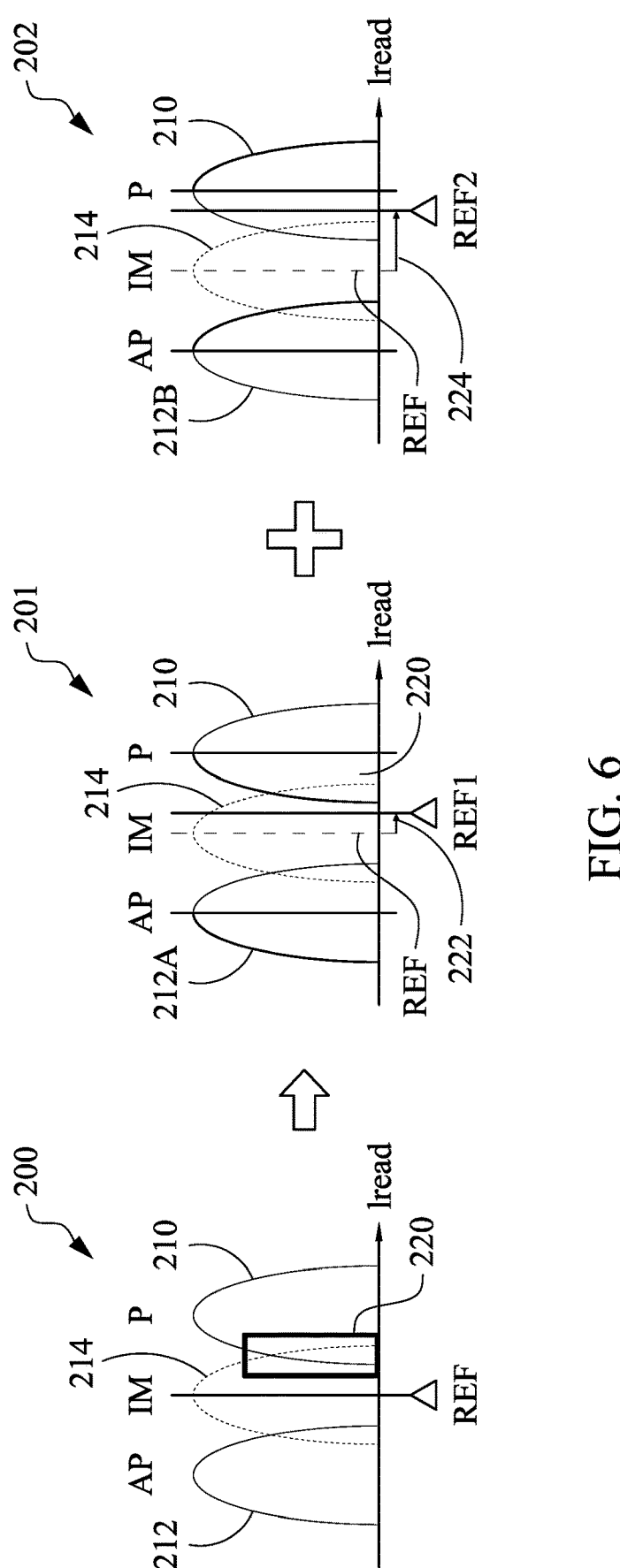
FIG. 6 includes charts illustrating examples of different reference states for the distribution of read currents shown in FIG. 5 in accordance with some embodiments.

In accordance with aspects of this disclosure, the reference value REF is varied for different MRAM cells or groups of MRAM cells such that the IM curve 214 does not overlap the P curve 210 and/or the AP curve 212. This facilitates more accurate detection of an IM state, which in turn may require a cell re-write. For example, FIG. 6 illustrates the read current curves 210, 214 and 212 for the P, IM and AP states, respectively, as shown in FIG. 3 in an "original reference" state 200, where the reference value REF is determined according to (Ip+Iap)/2 (i.e. at a midpoint between the AP curve 212 and P curve 210. In addition to the base reference state 200, employing the base reference REF, FIG. 6 shows a first reference state 201 and second reference state 202, each of which use respective reference values REF1 and REF2 in place of the original or base reference REF. In this manner, the overlap region 220 where the IM curve 214 and P curve 210 is effectively eliminated.

The first reference state 201 uses the first reference value REF1 for determining the written state of a first group 212A of the AP cells. The first group of AP cells 212A correspond to those MRAM cells 112 having a lower AP read current Iread. In other words, the read current Iread for the first group of AP cells 212A is on the left portion of the curve 212 indicating the portion of the AP read current Iread distribution having lower read currents Iread. For these cells, the reference value REF1 is greater than the original or base reference value REF by a first amount, moving the reference value REF1 to the right side of the chart by an amount indicated by the arrow 222 closer to the left portion of the P curve 210. In some embodiments, the sense amplifier 144 is configured to compare read currents Iread of the first group of AP cells 212A to the first reference REF1.

This effectively eliminates a portion of the IM curve 214 in the overlap region 220, and MRAM cells 112 corresponding to the first group of AP cells 212A are thus considered to be written to the P state if their Iread value is greater than (i.e. to the right of) the REF1 value. If the Iread value is less than (i.e. to the left of) the REF1 value, the AP cell is considered to not have been successfully written to the P state (i.e. write failure) and the cell is rewritten.

The second reference state 202 uses the second reference value REF2 for determining the written state of a second group 212B of the AP cells. The second group of AP cells 212B correspond to those MRAM cells 112 having a higher AP read current Iread. In other words, the read current Iread for these AP cells 212B is on the right portion of the curve 212 indicating the portion of the AP read current Iread distribution having higher read currents Iread. For these cells, the reference value REF2 is greater than the original or base reference value REF by a second amount greater than the first amount, moving the reference value REF2 farther to the right side of the chart closer to the right portion of the P curve 210 an amount indicated by the arrow 224. In some embodiments, the sense amplifier 144 is configured to compare read currents Iread of the second group of AP cells to the second reference REF2.

This effectively eliminates a portion of the P curve 210 in the overlap region 220, and MRAM cells 112 corresponding to the second group of AP cells 212B are thus considered to be written to the P state if their Iread value is greater than (i.e. to the right of) the REF2 value. If the Iread value is less than (i.e. to the left of) the REF2 value, the AP cell is considered to not have been successfully written to the P state (i.e. write failure) and the cell is rewritten.

Figure 7:
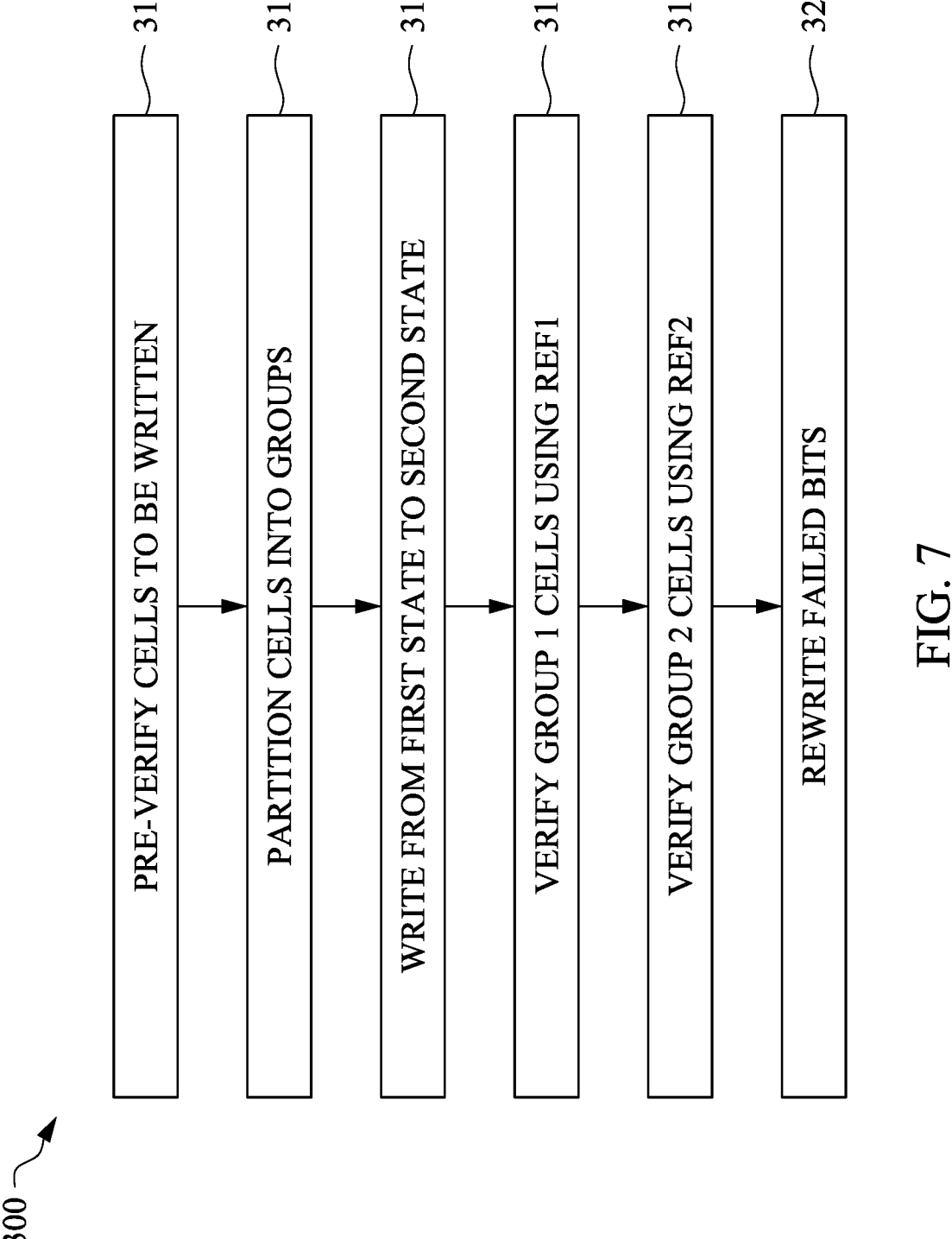
FIG. 7 illustrates an example of a method for determining an intermediate (IM) state of MRAM cells in accordance with some embodiments.

FIG. 7 illustrates a method 300 in accordance with disclosed embodiments for determining an IM state of MRAM cells 112 and rewriting these cells when necessary. The example of FIG. 7 further describes the partitioning process shown in FIG. 6, and corresponds to a situation where MRAM cells 112 are being written from a first state (e.g. the AP state) to a second state (e.g. the P state). However, the illustrated method also applies to writing from the P state to the AP state, for example.

More particularly, in the example where MRAM cells 112 are to be written from AP to P states discussed above, the MRAM cells 112 are pre-verified to determine which cells need to be written from AP to P at operation 310. In other words, at operation 310 the cell is read using a "base" or "conventional" reference value such as that shown in FIG. 3 to identify the MRAM cells 112 that are in the AP state (i.e., cells having an Iread current corresponding to the curve 212). In some examples, the base reference value REF for operation 310 is determined according to (Ip+Iap)/2, where Ip is the read current Iread for the P state and Iap is the read current Iread for the AP state. FIG. 8 illustrates such an AP curve 212, where MRAM cells 112 demonstrating read currents Iread that fall onto this curve would be verified as requiring a write to the P state. In other words, the MRAM cells are pre-verified by comparing a base read current of the MRAM cells 112 to the base reference value REF. In some embodiments, the sense amplifier 144 is configured to compare read currents Iread of the AP cells to the reference REF to pre-verify the MRAM cells 112. Thus, in operation 310, any MRAM cells 112 that are determined to already be in the second, or P state (i.e. Iread current corresponds to the P curve 210) do not need to be written to the P state. For instance, the memory controller 102 may include a first or "target" register that stores target values for each of the MRAM cells 112. The pre-verification operation 310 may include reading the MRAM cells 112 and storing the read results for each in a second or "read" register. A bit-by-bit comparison of the target register and the read register will identify (i.e. verify) those MRAM cells 112 that that need to be written from the AP to the P state.

At operation 312, the MRAM cells 112 in the AP state that are to be written to the P state are partitioned into multiple groups based on the location of their corresponding Iap current on the AP curve 212. In some examples, the identified MRAM cells 112 are partitioned into two groups or into three groups, or into more than three groups. In some examples, the MRAM cells are partitioned into the plurality of groups prior to the pre-verification operation 310. As noted above, MRAM cells 112 having a read current Iread in accordance with the AP curve 212 (i.e. AP cells) are pre-verified in operation 310 as requiring a write from the AP state to the P state. FIG. 9 shows an example where the AP cells identified at operation 310 are partitioned into a first group 212A (left, lower AP Iread current) and a second group 212B (right, higher AP Iread current) using the peak of the AP read current distribution Iap as a partition reference value REF_AP. In some implementations, an identifier designating each MRAM cell's partition group (e.g. first group 212A or second group 212B) may be stored in a memory, such as a third or "partition" register. Thus, each bit of the partition register may store a logic 0 to designate a corresponding MRAM memory cell 112 as a first group 212A MRAM cell, while the partition register may store a logic 1 to designate a corresponding MRAM memory cell 112 as a second group 212B MRAM cell At operation 314 of FIG. 7 the identified AP cells 212A, 212B are written from a first state (e.g. the AP state) to a second state (e.g. the P state) as indicated by the arrow 230 illustrated in FIG. 10. After the write process of operation 314, the written cells are verified.

More specifically, at operation 316, a first reference value is used to verify the first group 212A. In some examples, the reference value is increased by a first amount. In some examples, the first reference value REF1 (i.e. the reference for the left AP group 212A) is determined according to (Ip+Iap)/2+m, where m is a predetermined reference increase amount. In other examples, the reference value is increased over the base reference REF by a predetermined current amount, a predetermined percentage, a percentage or portion of the original or base reference value REF, a percentage or portion of the Ip or Iap currents, etc.

Thus, as shown in FIG. 11, the first reference value REF1 is moved to the right of the base reference REF by a first amount such that for a successful write verification from AP to P states, the Iread current needs to be greater than the base reference value REF (e.g. Ip+Iap)/2) by at least the amount indicated by the arrow 222 (i.e. REF1). AP cells 212A having a read current less than the first reference value REF1 are considered write failures, which are recorded. In some examples, the sense amplifier 144 thus compares the read current Iread for the MRAM cells 112 of the first AP group 212A to the first reference value REF1. In other words, the verification for the first AP cell group 212A includes reading the MRAM cells 112 of the first AP cell group 212A using the first reference value REF1. Read results based on comparing the read current Iread to the first reference value REF1 may be recorded to a memory, such as the read register discussed above. Contents of the read register may then be compared to the corresponding bits of the target register, and matching values are considered a successful write while values that do not match are considered write failures.

The process is then repeated for the next (e.g. second) AP group cells 212B. As noted above, these cells 212B have a higher AP read current Iread, and thus the read current Iread indicating a successful write to the P state is also higher. As shown in operation 318, a second reference value REF2 is used to verify the second group 212B. The reference value for the second AP group 212B is increased by a second amount 224, moving the reference value farther to the right as shown in FIG. 12. As shown in FIG. 9, the second AP group 212B has an Iread current that is greater than the first group 212A. Thus, the Iread current for the second group 212B increases more to be considered successfully written to the P state (rather than being considered an IM state). In some examples, the second reference value REF2 (i.e. the reference for the right AP group 212B) is determined according to Ip−n where n is a predetermined reference decrease amount. In other examples, the reference value is decreased from the Ip current level by a predetermined current amount, a predetermined percentage, a percentage or portion of the original or base reference value REF, a percentage or portion of the Ip or Iap currents, etc. Still further, in some example m=n. Moreover, in still further examples, the second reference value REF2 is determined according to (Ip+Iap)/2+n, where n>m. Thus, the second reference value REF2 is moved farther to the right, and the Iread current needs to be greater than base reference REF by at least the amount 224 (i.e. greater than REF2) to be considered written to the P state, rather than an IM state. Second AP group 212B write fail bits—cells having Iread current less than the reference value REF2—are recorded. In some examples, the sense amplifier 144 thus compares the read current Iread for the MRAM cells 112 of the second AP group 212B to the second reference value REF2. In other words, the verification for the second AP cell group 212B includes reading the MRAM cells 112 of the second cell group 212B using the second reference value REF2. Read results based on comparing the read current Iread to the second reference value REF2 may be recorded to a memory, such as the read register discussed above. Contents of the read register may then be compared to the corresponding bits of the target register, and matching values are considered a successful write while values that do not match are considered write failures.

Moreover, the controller 102 is configured to provide the reference values REF1 and REF2 to the sense amplifier 144 for the corresponding cell groups 212A and 212B in some embodiments. Still further, the controller 102 may be configured to calculate the reference values REF1 and REF2 as noted above. In other examples, the sense amplifier 144 may include multiple sense amplifiers, each receiving a different reference value (e.g., one sense amplifier receives REF1 and another receives REF2). The controller 102 in such an embodiment further includes logic circuitry to select the relevant sense amplifier output based on whether the cell group 212A or the cell group 212B memory cells are being verified.

At operation 320 of FIG. 7, any write fail bits recorded at operations 316 and 318 are rewritten.

As noted above, the disclosed processes are not limited to partitioning the MRAM cells 112 to be written into two groups. In other examples, more than two groups are used in the partitioning process. FIGS. 13-16 illustrate an example where the AP cells 212 are partitioned into three groups, including group 212A (left portion of the AP current curve— lower AP Iread current), 212B (right portion of the AP current curve—higher AP Iread current), and 212C (middle portion of the AP current curve—AP Iread current between the first group 212A and second group 212B). For purposes of partitioning the AP cells group 212 into the three groups 212A, 212B and 212C, the peak of the AP read current±some predetermined amount may be used to determine two partition reference values REF_AP1 and REF_AP2. In some examples, REF_AP1 and REF_AP2 are determined according to Iap±m.

Figure 14:
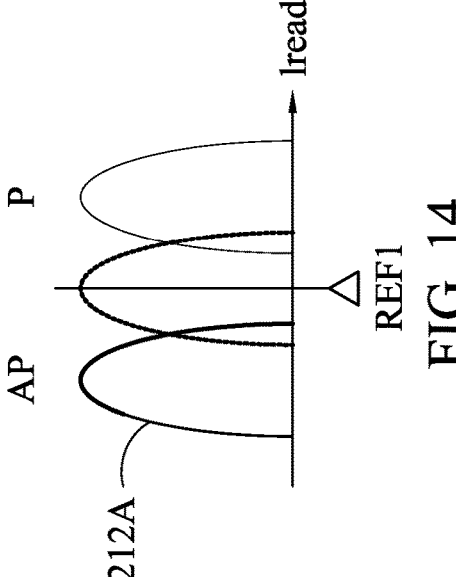
FIGS. 13-16 are charts illustrating aspects of an alternative method to that illustrated in FIGS. 8-12 in accordance with some embodiments.
Figure 16:
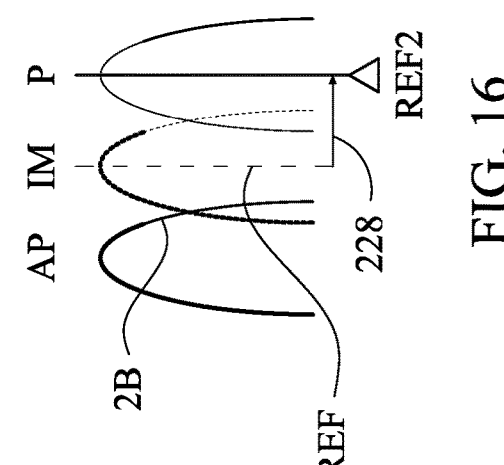

The AP cells 212 to be written to the P state (i.e. groups 212A, 212B, 212C) are so written, and as shown in FIG. 14, the first reference value is used to verify the first group 212A. In the example of FIG. 14, the first reference REF1 is the same as the base reference REF (i.e. (Ip+Iap)/2. Thus, as shown in FIG. 14, the Iread current for the first group 212A needs to be greater than the first reference REF1 (i.e. the base reference value REF) to be considered a successful write from the AP state to the P state. AP cells 212A having a read current less than the first reference value REF1 are considered write failures.

In some examples, the second reference value REF2 is increased over the first reference value REF1 (i.e. REF) by a first amount. In some examples employing three AP groups, the second reference value REF2 (i.e. the reference for the middle AP group 212C) is determined according to (Ip+Iap)/2+m. As noted above, m is a predetermined reference increase amount such as a predetermined current amount, a predetermined percentage, a percentage or portion of the original or base reference value REF, a percentage or portion of the Ip or Iap currents, etc.

Figure 15:
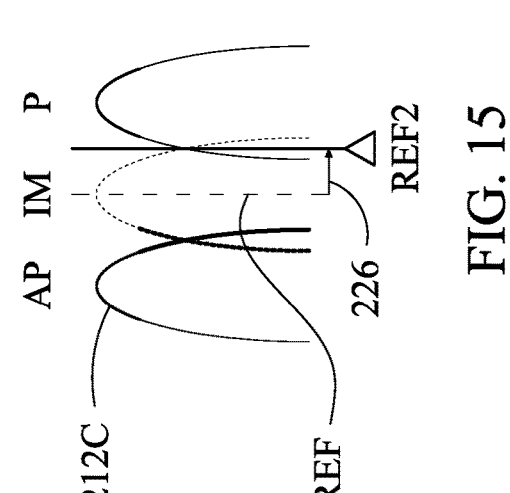

Thus, as shown in FIG. 15, the second reference value REF2 is moved to the right of the first reference REF1 by an amount indicated by an arrow 226, such that for a successful write verification from AP to P states for the middle group of AP cells 212C, the Iread current needs to be greater than the first reference value REF1 by at least the amount 226 (i.e. REF2). AP cells 212C having a read current less than the second reference value REF2 are considered write failures.

The process is then repeated for the next (e.g. second) AP group cells 212B. These cells 212B have a still higher AP read current Iread than cells of the first and third groups 212A and 212C, and thus the read current Iread indicating a successful write to the P state is also higher for the group 212B. Accordingly, a third reference value REF3 for the AP group 212B is further increased, moving the reference value farther to the right as indicated by the arrow 228 shown in FIG. 16.

Figure 13:
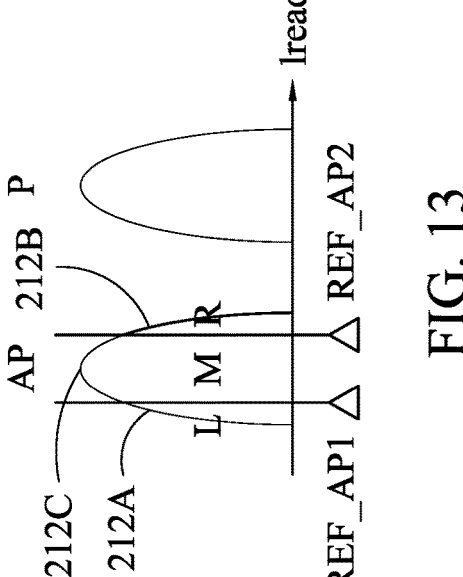

As shown in FIG. 13, the second AP group 212B has an Iread current that is greater than both the first group 212A (i.e. left) and the third group 212C (i.e. middle). Thus, the Iread current for the second group 212B increases still further to be considered successfully written to the P state (rather than being considered an IM state). In some examples, the third reference value REF3 is the Ip current. In other examples, REF3 is determined otherwise, such as a predetermined increase over the Iap or (Ip+Iap)/2 values or a predetermined decrease below the Ip value. Thus, the third reference value REF3 is moved still farther to the right, and the Iread current needs to be greater than the first reference REF1 (i.e. the base reference REF) by at least the amount 228 (i.e. greater than REF3) to be considered written to the P state.

As noted above in the discussion of FIG. 7, write failures are recorded and then rewritten in accordance with operation 320.

The present disclosure is not limited to partitioning the cells to be written into two or three groups. The MRAM cells to be written from the first state to the second state may be partitioned in to more than three groups, where writing from the first state to the second state would be verified using a corresponding number of reference values. In still further embodiments, each cell to be written from the first state to the second state is verified using an individual reference value. In other words, each "group" can be considered to have a single MRAM cell in some examples.

Figure 18:
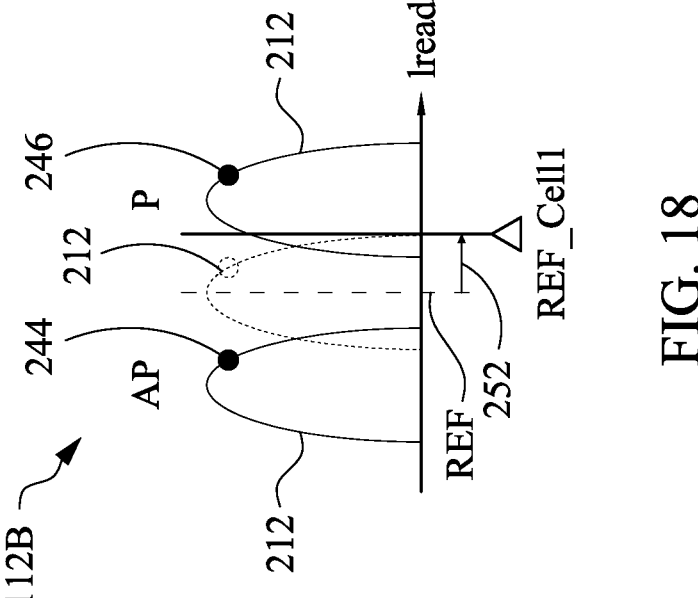
FIGS. 17 and 18 are charts illustrating aspects of another alternative method to those illustrated in FIGS. 8-16 in accordance with some embodiments.
Figure 17:
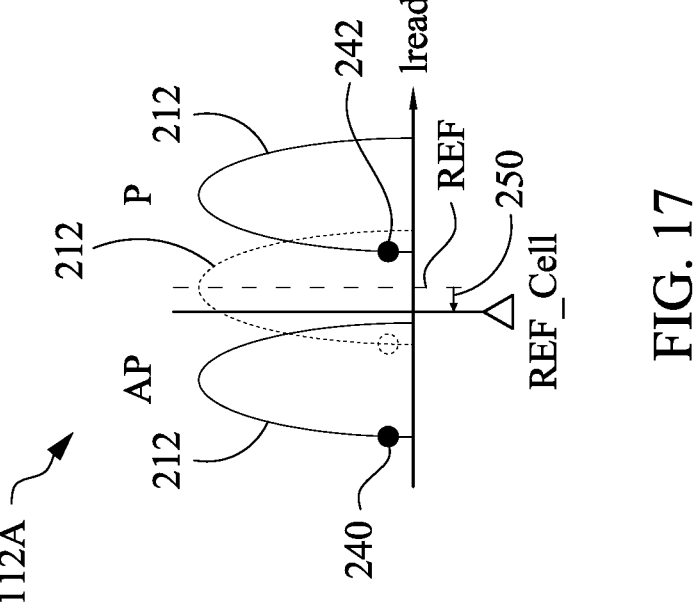

FIGS. 17 and 18 illustrate an example where a reference value for each cell is determined. In other words, each of the memory cells has a corresponding reference value used for verifying the write process. The magnetic tunnel junction (TMR) for the MTJ of each MRAM cell 112 is typically predictable and repeatable. As such, the Iread current indicating an individual MRAM cell 112 first state (e.g. AP state) may be determined and recorded. FIG. 17 illustrates an example where a first MRAM cell 112A has a first Iread current level 240 indicating a first state, such as the AP state shown in FIG. 17. Assuming the first cell 112A demonstrates a second Iread current level 242 for the P state at a relatively similar location of the P curve, the individual cell reference REF_Cell1 is adjusted based on a current ratio or current delta between the AP Iread level 240 and the P Iread level 242. The base reference value REF (e.g. (Ip+Iap)/2) may thus be adjusted accordingly by an amount 250.

FIG. 18 illustrates an example where a second MRAM cell 112B has a first Iread current level 244 indicating the AP state at another location on the AP curve 212, and a second Iread current level 246 for the P state at a relatively similar location of the P curve. As such, the individual cell reference REF_Cell2 is adjusted based on a current ratio or current delta between the AP Iread level 244 and the P Iread level 246 as indicated at 252.

Figure 20:
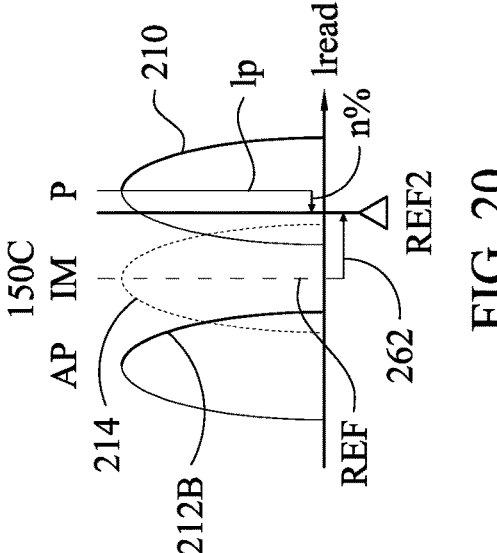
FIGS. 19-22 are charts illustrating application of disclosed methods to different temperature implementations in accordance with some embodiments
Figure 19:
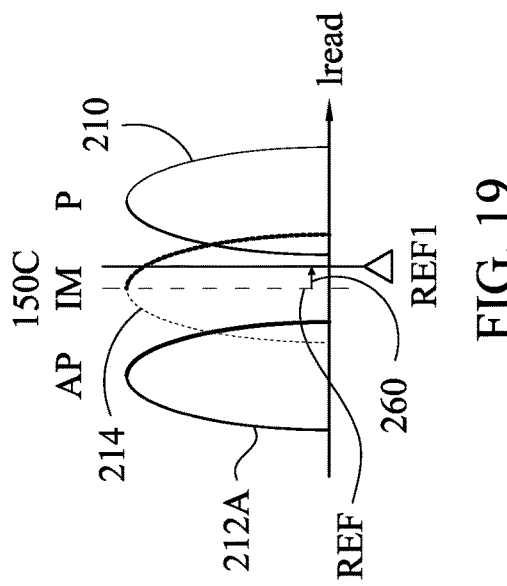

The processes for addressing IM issues apply to MRAM operation at varying temperatures. The MRAM cell 112 resistance levels at the AP and/or P states may vary according to temperature. FIGS. 19 and 20 illustrate an example for a high temperature level (e.g. 150C), and FIGS. 21 and 22 illustrate an example for a low temperature level (e.g. −40 C), showing the read current curves 210, 214 and 212 for the P, IM and AP states, respectively, for the high and low temperature situations, respectively.

Figure 22:
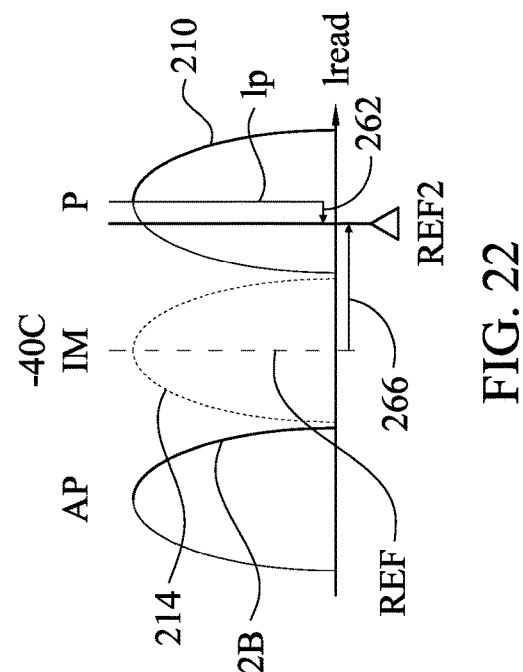
Figure 21:
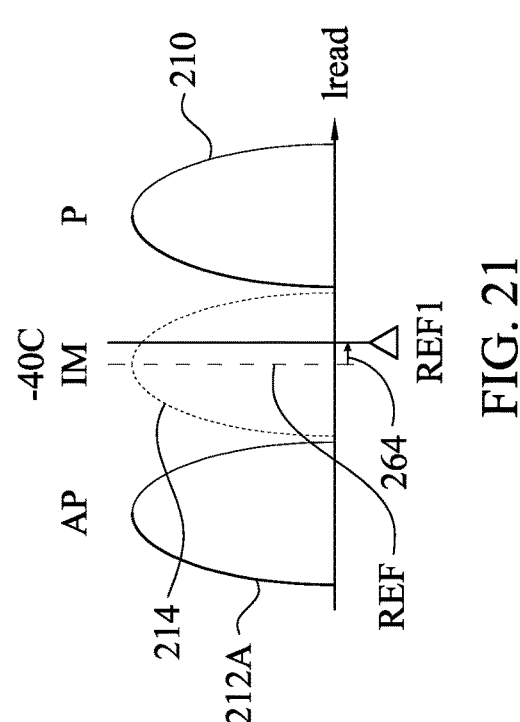

FIGS. 19 and 21 show the first reference state 201 and FIGS. 20 and 22 show second reference state 202 for the high and low temperature MRAM cells. As with the example of FIG. 6, the first and second reference states 201, 202 use respective reference values REF1 and REF2 in place of the original or base reference REF.

The first reference states 201 shown in FIGS. 19 and 21 use the first reference value REF1 for determining the written state of the first group 212A of the AP cells, which correspond to those MRAM cells 112 having a lower AP read current Iread. For these cells, the reference value REF1 is greater than the original or base reference value REF by a first amount, moving the reference value REF1 to the right side of the chart by an amount indicated by the arrow 262 closer to the left portion of the P curve 210.

The second reference state 202 shown in FIGS. 20 and 22 use the second reference value REF2 for determining the written state of the second group 212B of the AP cells, which correspond to those MRAM cells 112 having a higher AP read current Iread. For these cells, the reference value REF2 is greater than the original or base reference value REF by a second amount greater than the first amount, moving the reference value REF2 farther to the right side of the chart closer to the right portion of the P curve 210 an amount indicated by the arrow 264.

Comparing the read current curves 210, 214 and 212 of FIGS. 21 and 22 to the corresponding read current curves 210, 214 and 212 of FIGS. 19 and 20 shows the read current curves 210, 214 and 212 have a different shape in the low temperature implementation as compared to the high temperature situation. This is due to variations in the TMR due to the temperature differences.

In the example of FIGS. 19 and 21, the first reference value REF1 is determined according to (Ip+Iap)/2+m %, where m % is a predetermined reference increase percentage. In the example of FIGS. 20 and 22, the second reference value REF2 is determined according to Ip−n % where n % is a predetermined reference decrease percentage. Since the first and second reference values REF1, REF2 are based on percentage differences, the illustrated IM solution is effective for both the high temperature and low temperature implementations.

Thus, aspects of the present disclosure address issues associated with the IM phenomenon. For instance, situations where MRAM a portion of an IM read current curve overlaps with an Iread curve for the AP or P states can make the MRAM write process difficult is it can be difficult to verify the MRAM cell write. Prior attempts to address can impact soft error rates (SER) and Endurance and Write Throughput. In accordance with disclosed examples, MRAM write cells are partitioned into multiple MRAM cell groups, and reference values are implemented for respective MRAM cell groups effectively eliminate IM overlap with the P/AP states.

In some examples, a method for identifying an IM state of MRAM cell writes includes providing a plurality of MRAM cells and partitioning the plurality of MRAM cells into a plurality of groups including a first group and a second group. A first MRAM cell of the first group is written from a first state to a second state and a second MRAM cell of the second group is written from the first state to the second state. The writing of the first MRAM cell is verified, including comparing a first read current of the first MRAM cell to a first reference value. The writing of the second MRAM cell is verified, including comparing a second read current of the second MRAM cell to a second reference value.

In accordance with further disclosed examples, a memory device includes a first group of MRAM cells with a first MRAM cell and a second group of MRAM cells with a second MRAM cell. A sense amplifier is configured to compare a first read current of the first MRAM cell to a first reference value, and to compare a second read current of the second MRAM cell to a second reference value that is different from the first reference value.

In accordance with still further examples, a method for identifying an IM state of MRAM cell writes includes providing a plurality of MRAM cells and partitioning the plurality of MRAM cells into a plurality of groups including a first group having a first plurality of MRAM cells and a second group having a second plurality of MRAM cells. A a base read current of each of the first plurality of MRAM cells and of each of the second plurality of MRAM cells is compared to a base reference value. Selected ones of the first plurality of MRAM cells are written from a first state to a second state based on the comparing. Selected ones of the second group of MRAM cells are written from the first state to the second state based on the comparing. A first read current of each of the first plurality of MRAM cells is compared to a first reference value different than the base reference value, and a second read current of each of the second plurality of MRAM cells is compared to a second reference value different than the base reference value and the first reference value.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a plurality of magnetoresistive random-access memory (MRAM) cells;
partitioning the plurality of MRAM cells into a plurality of groups including a first group and a second group;
writing a first MRAM cell of the first group from a first state to a second state;
writing a second MRAM cell of the second group from the first state to the second state;
verifying the writing of the first MRAM cell, including comparing a first read current of the first MRAM cell to a first reference value; and
verifying the writing of the second MRAM cell, including comparing a second read current of the second MRAM cell to a second reference value.

2. The method of claim 1, wherein each of the plurality of MRAM cells includes a magnetic tunnel junction (MTJ) element.

3. The method of claim 1, wherein the first state is an anti-parallel state (AP).

4. The method of claim 3, wherein the second state is a parallel state (P).

5. The method of claim 4, further comprising identifying a write-fail of the first MRAM cell if the first read current of the first MRAM cell is less than the first reference value.

6. The method of claim 4, further comprising identifying a write-fail of the second MRAM cell if the second read current of the second MRAM cell is less than the second reference value.

7. The method of claim 4, wherein the second reference value is greater than the first reference value.

8. The method of claim 4, further comprising:
determining a base reference value;
determining the first reference value by increasing the base reference value by a first amount; and
determining the second reference value by increasing the base reference value by a second amount greater than the first amount.

9. The method of claim 8, wherein the base reference value is determined according to (Ip+Iap)/2, where Ip is a peak read current for a P state curve and Iap is a peak read current for an AP state curve.

10. The method of claim 8, wherein the first reference value is determined according to (Ip+Iap)/2+m, where m is a predetermined reference increase amount.

11. The method of claim 8, wherein the second reference value is determined according to Ip-n, where n is a predetermined reference decrease amount.

12. The method of claim 1, wherein the plurality of groups further includes a third group, and wherein the method further comprises:
writing a third MRAM cell of the third group from the first state to the second state; and
verifying the writing of the third MRAM cell, including comparing a third read current of the third MRAM cell to a third reference value.

13. The method of claim 8, further comprising:
pre-verifying the first state of the first MRAM cell, including comparing a first state read current of the first MRAM cell to the base reference value; and
pre-verifying the first state of the second MRAM cell, including comparing a first state read current of the second MRAM cell to the base reference value.

14. The method of claim 1, wherein the first group includes only the first MRAM cell, and wherein the second group includes only the second MRAM cell.

15. A memory device, comprising:
a first group of magnetoresistive random-access memory (MRAM) cells including a first MRAM cell;
a second group of MRAM cells including a second MRAM cell; and
a sense amplifier configured to compare a first read current of the first MRAM cell to a first reference value, and to compare a second read current of the second MRAM cell to a second reference value that is different from the first reference value;
wherein the first and second MRAM cells are configured to be selectively written from a first state to a second state, and wherein the sense amplifier is configured to:
verify a writing of the first MRAM cell from the first state to the second state by the comparing the first read current of the first MRAM cell to the first reference value; and
verify a writing of the second MRAM cell from the first state to the second state by the comparing the second read current of the second MRAM cell to the second reference value.

16. The memory device of claim 15, wherein the second reference value is greater than the first reference value.

17. The memory device of claim 15, wherein the first state is an anti-parallel state (AP) and the second state is a parallel state (P).

18. A method, comprising:
providing a plurality of magnetoresistive random-access memory (MRAM) cells;
partitioning the plurality of MRAM cells into a plurality of groups including a first group having a first plurality of MRAM cells and a second group having a second plurality of MRAM cells;
comparing a base read current of each of the first plurality of MRAM cells and of each of the second plurality of MRAM cells to a base reference value;
based on the comparing, writing selected ones of the first plurality of MRAM cells from a first state to a second state;
based on the comparing, writing selected ones of the second group of MRAM cells from the first state to the second state;
comparing a first read current of each of the first plurality of MRAM cells to a first reference value different than the base reference value; and
comparing a second read current of each of the second plurality of MRAM cells to a second reference value different than the base reference value and the first reference value.

19. The method of claim 18, further comprising:

identifying write-fails of the first plurality of MRAM cells based on the comparing the first read current; and identifying write-fails of the second plurality of MRAM cells based on the comparing the second read current.

20. The method of claim 19, wherein the first state is an anti-parallel state (AP) and the second state is a parallel state (P).

\* \* \* \* \*